(12) United States Patent
Hack et al.

(10) Patent No.: US 10,764,212 B2
(45) Date of Patent: Sep. 1, 2020

(54) MODULAR SWITCHING NETWORK NODE FOR A COMMUNICATIONS NETWORK

(75) Inventors: Heiko Hack, Forchheim (DE); Timo Kistner, Kuppenheim (DE); Urs Schweizer, Malsch-Waldprechtsweier (DE); Andreas Schäffler, Karlsruhe (DE); Michael Wagner, Rheinzabern (DE)

(73) Assignee: Siemens Aktiengesellschaft, Munich (DE)

(*) Notice: Subject to any disclaimer, the term of this patent is extended or adjusted under 35 U.S.C. 154(b) by 715 days.

(21) Appl. No.: 13/299,102

(22) Filed: Nov. 17, 2011

(65) Prior Publication Data

US 2012/0294156 A1 Nov. 22, 2012

(30) Foreign Application Priority Data

Nov. 19, 2010 (EP) .................................. 10191858

(51) Int. Cl.
*H04L 12/931* (2013.01)
*H05K 7/14* (2006.01)

(52) U.S. Cl.
CPC ......... *H04L 49/351* (2013.01); *H05K 7/1472* (2013.01)

(58) Field of Classification Search
CPC .......................... H04L 49/351; H05K 7/1472
See application file for complete search history.

(56) References Cited

U.S. PATENT DOCUMENTS

| | | | | |
|---|---|---|---|---|
| 6,636,917 B1 * | 10/2003 | Linares et al. | ................ | 710/300 |
| 6,895,443 B2 * | 5/2005 | Aiken | ............................ | 370/389 |
| 6,944,158 B1 * | 9/2005 | Wilson et al. | ................ | 370/392 |
| 7,085,237 B1 * | 8/2006 | Teodorescu | ................... | 370/242 |
| 7,085,875 B1 | 8/2006 | Yona et al. | | |
| 7,188,205 B2 * | 3/2007 | Le et al. | ........................ | 710/300 |
| 7,447,931 B1 * | 11/2008 | Rischar | ................ | H04J 3/0697 370/509 |

(Continued)

FOREIGN PATENT DOCUMENTS

| | | |
|---|---|---|
| TW | 200719107 | 5/2007 |
| WO | WO 03/077088 A1 | 9/2003 |

OTHER PUBLICATIONS

Moxa: "Industrial Ethernet for Control and Automation"; May 6, 2010; XP-002642160; Others; 2010.

(Continued)

*Primary Examiner* — Gregory B Sefcheck
*Assistant Examiner* — Joshua Smith
(74) *Attorney, Agent, or Firm* — Cozen O'Connor

(57) ABSTRACT

A modular switching network node for a communications network, i.e., an industrial communications network, where the modular switching network node comprises a switching network node base unit and at least one port module, the at least one port module comprises at least one connection interface for coupling to the communications network, and where the modular switching network node is configured to forward communication data over one of the connection interfaces of the modular switching network node to at least one additional connection interface of the modular switching network node. The switching network node base unit is configured such that at least one of the port modules is swappable for a functional module to expand the functionality of the switching network node.

16 Claims, 1 Drawing Sheet

(56) References Cited

U.S. PATENT DOCUMENTS

| | | |
|---|---|---|
| 7,623,444 B2 * | 11/2009 | Ra et al. ................... 370/220 |
| 7,664,110 B1 | 2/2010 | Lovett et al. |
| 8,156,232 B2 | 4/2012 | Callaghan et al. |
| 2001/0043568 A1 * | 11/2001 | McHale ............... H04L 12/2856 370/401 |
| 2003/0236937 A1 * | 12/2003 | Barros De Almeida et al. ........... 710/305 |
| 2004/0185775 A1 * | 9/2004 | Bell et al. ................ 455/12.1 |
| 2004/0218583 A1 * | 11/2004 | Adan et al. ................... 370/352 |
| 2004/0246982 A1 * | 12/2004 | Krishnamurthy et al. ... 370/422 |
| 2005/0083949 A1 * | 4/2005 | Dobbins et al. ......... 370/395.53 |
| 2005/0182883 A1 * | 8/2005 | Overtoom .................. 370/351 |
| 2006/0251009 A1 * | 11/2006 | Thommana et al. ......... 370/352 |
| 2007/0061018 A1 | 3/2007 | Callaghan et al. |
| 2007/0064724 A1 * | 3/2007 | Minami ............... H04L 12/2602 370/463 |
| 2007/0180181 A1 * | 8/2007 | Chen et al. ................... 710/300 |
| 2007/0240006 A1 * | 10/2007 | Fung ..................... G06F 1/32 713/323 |
| 2008/0212568 A1 * | 9/2008 | So ........................ H04L 12/66 370/352 |
| 2009/0089226 A1 * | 4/2009 | Bradford et al. ............. 370/230 |
| 2009/0119437 A1 * | 5/2009 | Hilscher ............... H04L 12/407 710/305 |
| 2009/0168806 A1 * | 7/2009 | Van de Steeg et al. ...... 370/498 |
| 2009/0210069 A1 * | 8/2009 | Schultz et al. .............. 710/267 |
| 2009/0228626 A1 * | 9/2009 | Hou et al. .................... 710/305 |
| 2010/0207790 A1 * | 8/2010 | Toyota ............... H03M 1/1028 341/118 |
| 2012/0113899 A1 * | 5/2012 | Overmars ................... 370/328 |

OTHER PUBLICATIONS

Search Report dated Jul. 15, 2015 corresponding to Taiwanese Patent Application No. 100141574.

* cited by examiner

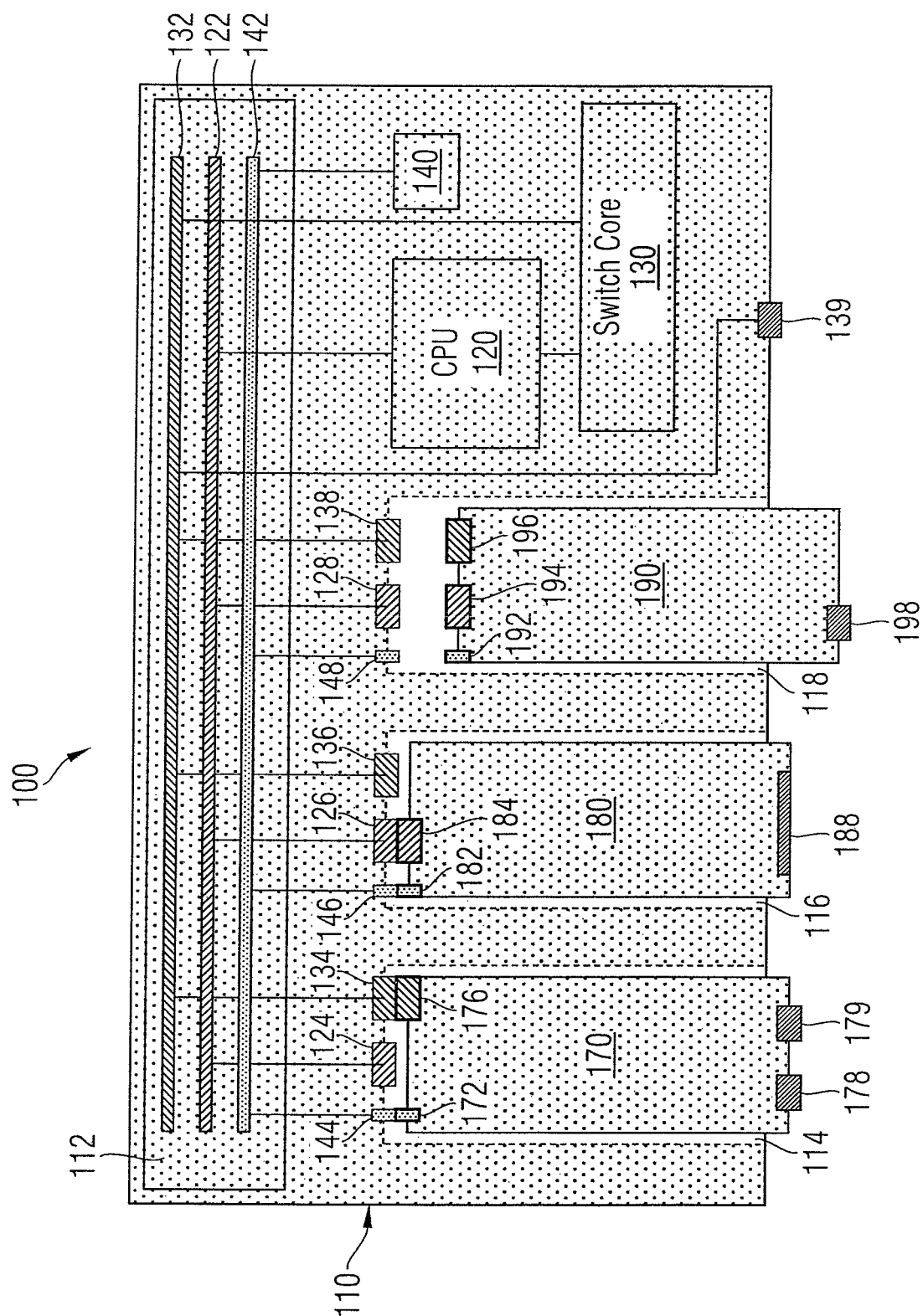

MODULAR SWITCHING NETWORK NODE FOR A COMMUNICATIONS NETWORK

BACKGROUND OF THE INVENTION

1. Field of the Invention

The present invention relates to switching nodes and, more particularly, to a modular switching network node for a communications network, i.e., an industrial communications network, where the modular switching network node comprises a switching network node base unit and at least one port module, and where the at least one port module comprises at least one connection interface for coupling to a communications network, and the modular switching network node is configured to forward communication data through a connection interface of the modular switching network node to at least another of the connection interfaces of the modular switching network node.

2. Description of the Related Art

Switching network nodes are known from the prior art. For example, U.S. Pat. No. 7,085,875 B1 discloses a modular switch for an Ethernet and/or an ATM network with plug-in cards that each comprise ports for such networks or in turn can be or are connected to corresponding ports. One drawback of the prior art switching nodes is that, although the number and/or type of communication interfaces may be changed in this way, such a switch cannot be flexibly adapted to new applications or communication protocols, because the underlying properties of the switch remain unchanged even when a port module is changed.

SUMMARY OF THE INVENTION

It is therefore an object of the present invention to provide a switching network node for a communications network, i.e., an industrial communications network, which can be flexibly adapted to changed or new requirements.

This and other objects and advantages are achieved by providing a modular switching network node that is set up for forwarding communication data within a communications network or between communications networks, i.e., within or between industrial communications networks, and which comprises a switching network node base unit and at least one port module, where the at least one port module comprises at least one connection interface for coupling to the communications network.

In accordance with the invention, the modular switching network node is configured to forward communication data arriving at one of the connection interfaces of the modular switching network node to at least another of the connection interfaces of the modular switching network node, and the switching network node base unit is also configured such that at least one of the port modules can be swapped for a functional module to expand the functionality of the switching network node. The port module may also be swapped for an alternate port module.

Here, the alternate port module can, for example, be similar to the port module in order, for example, to replace a defective port module or, for example, have a different design, number and/or combination thereof of connection interfaces to therefore be able to modify the communication capacity of the modular switching network node and enable it to be adapted to current circumstances.

Due to the possibility of using a functional module instead of a port module for expanding the functionality of the switching network node, the modular switching network node is adaptable to new requirements, protocols, applications, functionalities or the like. As a result of the fact that the functional module can replace a port module, such an expansion does not entail any constructional enlargement of the modular switching network node either, and empty spaces do not have to be planned in the switching network node from the start therefore to be able to potentially expand the functionality at a later date. It is therefore also possible, for example, for a modular switching network node already fitted in a unit to be able to remain there unchanged or to be used again at the same location.

In an embodiment, the switching network node is configured as a switch, bridge, hub, router or a similar switching network node for forwarding and distributing communication data within a communications network or between communications networks or communication sub-networks. In alternative embodiments such communications networks comprise industrial communications networks.

Communications networks can, for example, be an Ethernet, an ATM network, a telecommunications network, a wireless network, the Internet or other comparable telecommunications networks.

In another embodiment, the industrial communications network comprises an industrial Ethernet (for example, an industrial Ethernet), a PROFINET, an industrial WLAN network or another industry communications network or a fieldbus.

Connection interfaces can, for example, be appropriate plugs or sockets, for example, for connecting appropriate communication cables, such as an RJ45-Ethernet plug for connecting an Ethernet cable. In other embodiments, the connection interfaces are configured for connecting a WLAN antenna or comparable antenna for a wireless network. In alternative embodiments, the connection interface comprises a cable lead out of a port module or the switching network node for connection to further cables or, another device or, for an antenna for a WLAN network or telecommunications network.

That the modular switching network node is configured to forward communication data can, for example, mean that the switching network node has, for example, a switching functionality of an Ethernet switch or comparable switches for the above-stated communications networks, or parts or fundamental parts of such a functionality. Forwarding may also denote or include a routing functionality. In particular, within the context of such a forwarding functionality there may be provision that a certain message, which arrives over one of the connection interfaces, is not forwarded, for example. This can occur, for example, in the case where the receiver of the message is already located in the branch of the communications network from which the message to the switching network node came if the address of the message is blocked, or in which a different criterion is met. There may also be provision for a certain message to be output to a plurality of connection interfaces if, for example, the receiver is not known in the switching network node or it is, for example, a broadcast or multicast message.

A port module can comprise one or more connection interface(s). A port module can also comprise connection interfaces that differ in the data rates provided or processed and/or correspond to other communication protocols or communication standards.

The modular switching network node may also comprise further connection interfaces that are not part of a port module but are permanently provided on the modular switching network node.

The expansion of the functionality of the switching network node can, for example, be the addition of a new functionality, with this new functionality going beyond the mere addition or changing of communication interfaces (other communication protocols and/or data rates). The expansion of the functionality may, for example, be an addition of a functionality on the Open Systems Interconnection (OSI) layer "layer 4" or higher. In particular, the expansion of the functionality can denote the addition of a functionality on layer 4 to layer 7 in the OSI layer model.

The switching network node base unit and the port module and the functional module can, for example, be configured such that the port module can easily be swapped for the functional module, i.e., can be easily swapped by a user. This means, for example, that a user can remove the port module from the switching network node base unit in one or a few easy steps and instead likewise place the functional module at this location with one or a few easy steps.

The simple interchangeability can be provided, for example, by the respective modules being held in the base unit simply by the retaining forces of connected plug-in connections and optionally strain relief by a housing of module and/or base unit. There may also be provision for an additional locking or securing of the port module or of the functional modules against falling out or accidental removal of the module, for example, by a locking mechanism, a screw connection, a catch mechanism or the like. However, in this case the respective module may also be easily removed or inserted in the base unit in a few easy steps, for example, by releasing the screw connection or the locking or catch mechanism.

The object is also achieved by a switching network node base unit in accordance with the invention for a switching network node in accordance with the contemplated embodiments.

In such cases, the switching network node base unit can comprise one or more module-receiving region provided and set up for receiving one port module or one functional module each.

Adaptation of the switching network node to different applications may be simplified further in this way because simple interchangeability of modules and therefore simplified adaptation due to incorporation of a functional module, for example instead of a port module, may be attained due to the receiving regions.

Module-receiving regions can, for example, comprise empty spaces provided for receiving a module with appropriate sockets for connection of interfaces of the module to the switching network node base unit. Such empty spaces can comprise, for example, module slots and/or module sockets. Such a module-receiving region may, for example, also be configured such that the module is secured against accidental removal, such as falling out or accidental withdrawal. As stated above, due to the configuration of the switching network node base unit and configuration of the module this may be achieved, for example, simply by appropriate insertion forces and/or strain relief. A retaining facility to secure a module in the base unit may also be provided, for example, by a screw connection, catch mechanism or the like.

In an advantageous embodiment, the switching network node base unit comprises an internal network bus for forwarding communication data received over a connection interface within the switching network node base unit, and a system bus, where the system bus is particularly configured for communication with a central control unit of the switching network node. Here, the switching network node base unit also comprises, in the region of at least one module-receiving region, a network bus interface for contacting a port module located in the module-receiving region and a system bus interface for contacting a functional module located in the module-receiving region.

A module-receiving region, such as a module slot, is therefore already constructionally equipped for both correct processing of a port modules as well as for correct processing of a functional module. This therefore ensures that, irrespective of which functionality the functional module adds precisely to the switching network node, the functional module also has access to the system bus and therefore the central control unit of the switching network node and/or vice versa. The functionality of the switching network node may thus be flexibly expanded because for a functional module, for example, both the data on the network bus as well as information and settings handled by the central control unit are available.

An internal network bus can, for example, comprise an "internal high-speed network bus" or similar internal communications bus. A system bus can, for example, comprise an internal communications bus, for example, for communication between different components of a computer or switching network node. Such a bus can, for example, be configured as a "PCI", "PCI-Express" (PCIe) or as a comparable internal system bus.

The central control unit of the switching network node can, for example, be configured or set up as a CPU, a microprocessor or as a motherboard or a similar central control unit. The central control unit can, for example, form part of the switching network node base unit. The central control unit may also, for example, be completely or partly form part of a functional module.

There may also be provision, for example, for only one module-receiving region to comprise both a network bus interface and a system bus interface and therefore be configured for interchangeability between port modules and functional modules. A plurality of module-receiving regions of a switching network node base unit or even all module-receiving regions of the switching network node base unit may also be configured in this way.

Network bus interfaces and/or system bus interfaces can, for example, comprise appropriate plugs, sockets or contact elements or include the latter. Such plugs or sockets may comprise, for example, connector strips or the like as are regularly used for such bus interfaces.

Within the framework of the presently disclosed embodiments a "port module located in a module-receiving region" or a "functional module located in a module-receiving region" means that the respective module is at the location provided for it, and is in contact with the interfaces of the base unit provided for the module.

In addition to contact with the system bus over its system bus interface, a functional module located in the module-receiving region can also comprise a network bus interface with which the functional module is connected in the module-receiving region to the internal network bus. The functional module can, for example, comprise a purely functional module that solely adds an additional functionality to the switching network node. The functional module may also comprise as a combined functional and port module which takes on communication tasks as well as adding an additional functionality to the switching network node.

A port module and/or a functional module may also comprise a power supply interface that is configured for contacting a power source or a power supply unit in the switching network node base unit if the module is located in a module-receiving region of the base unit.

The switching network node base unit can also be configured for detection and/or configuration of a functional module located in one of its module-receiving regions. In particular, the switching network node base unit can be configured and set up for configuration and/or diagnosis of a functional module located in one of its module-receiving regions over a user interface of the switching network node.

This also results in simplified adaptability of the switching network nodes to changed requirements. As a result of the fact that the base unit can detect a functional module, such as automatically, and can therefore optionally adapt thereto accordingly, integration of the new functionality in the switching network node is simplified. As described above, detection and/or configuration of a new functional module introduced into a module-receiving region can occur, for example, automatically by way of the switching network node base unit or also, for example, following an activation step by a user by way of the switching network node base unit.

There may also be provision for the configuration and/or diagnosis of a functional module located in the base unit to be able to occur through a user interface of the switching network node. Thus, for example, a corresponding functional module and optionally its properties can be displayed on a user interface for the switching network node, for example, a web page, software user interface or some other operating unit for the switching network node and properties and parameters of the functional module can optionally also be adjusted thereby.

The above-stated object is also achieved by a functional module in accordance with the presently disclosed embodiments of a switching network node base unit in accordance with the disclosed embodiments.

The functional module may, for example, comprise a module system bus interface which may be configured for communication with the system bus interface of a module-receiving region of a switching network node base unit in accordance with the contemplated embodiments. The module system interface is configured for communication with the system bus interface in the case of a functional module being located in the module-receiving region.

A module system bus interface of this kind can be configured, for example, as a corresponding plug, socket or contact element for interaction with a system bus interface of the base unit. The functional module can also comprise a module network interface for communication with the network interface of a module-receiving region of a switching network node base unit in accordance with the disclosed embodiments, and a module power supply interface for supplying power to the functional module by way of the switching network node base unit.

The functional module can be configured such that, apart from the module system bus interface and a power supply interface, no further interfaces are provided for the switching network node base unit. There may also be provision for a functional module not to comprise any connection interfaces in accordance with the disclosed embodiments for coupling to communications networks or industrial communications networks. In this case, the functional module can comprise a purely functional module that solely adds a functionality to the switching network node and does not assume any further communication tasks and is not involved in any such tasks either.

A functional module can, however, also comprise external connection interfaces for communications networks according to the present description and also assume or influence communication tasks.

The functional module can also be configured such that it comprises connection interfaces in accordance with the disclosed embodiments for coupling to one or more communications networks, the communication data arriving over such connection interfaces being processed solely in the functional module and no forwarding to the internal network bus occurring.

The functional module can be configured for communication with the central control unit of the switching network node over the module system bus interface. In this way, a functional module can communicate, for example, with a CPU, motherboard or another central controller of the switching network node to, for example, adjust or change corresponding control mechanisms or configurations, or retrieve information from there.

In an advantageous embodiment, the functional module comprises, for example, an additional processing unit or central unit, in particular for supporting a central control unit of the switching network node, or includes such a processing unit or central unit. In this way, for example, the computing power or performance of the switching network node can be increased further and thus optionally adapted to changed performance requirements. By a coupling of such a functional module through the system bus to the central unit of the switching network node, the pending work may then be distributed among these components and the performance of the switching network node thus increased.

In the case of this example for a functional module and subsequently cited examples for functional modules, a PCI express (PCIe) bus, for example, may advantageously be used as the system bus, since this is generally well configured for internal communication between the central unit of a data processing device and corresponding functionally expanded add-on modules and plug-in cards.

A functional module may also comprise, for example, a server module for implementing a server functionality with an independent central unit or include such a functionality or such a server module. In this way, an add-on module can be achieved, for example, for implementing a radius server, a Dynamic Host Configuration Protocol (DHCP) server, monitoring functions or also comparable server functionalities.

A functional module can also comprise a display module and/or operating module for the switching network node. A functional module of this kind can include, for example, a display and/or input elements for inputting information, such as switches, buttons or even a touch screen. Communication data of individual or a plurality of ports of the switching network node, diagnostic data, status data or the like of individual or a plurality of ports of the switching network node can be configured with the display module. The display module can comprise, for example, a screen for example, for displaying text or images. Data for the switching network node, for example, can also be input and also configured with such a display and/or operating module. The configuration and adjustment of individual or a plurality of ports of the switching network node can also occur in this way.

The functional module can also comprise, for example, an energy-saving module for setting up and/or operating energy-saving functionalities of the switching network node or as an energy-saving module for the switching network node. Such energy-saving functionalities may include the adjustment, setting up and operation of different, power-save states of the switching network node or individual or a plurality of ports of the switching network node. A sleep function and correspondingly a wake-up function may also be implemented or improved for the switching network node by such an energy-saving module.

The functional module can also comprise a communication security module with a functionality for setting up and/or increasing security functions during communication over at least one of the connection interfaces of the switching network node. A communication security module of this kind can comprise, for example, separate external connection interfaces, and control and increase the security of communication via these interfaces. A communication security module of this kind can also monitor, set up and/or increase communication over other connection interfaces not located on this functional module. A communication security module can be set up, for example, solely for performing one of the two functionalities illustrated above or can also perform both of the functionalities.

Such security functions can, for example, be or include a firewall functionality, a Virtual Private Network (VPN) functionality, encryption and/or decryption of data or an authentication functionality. A functional module can also comprise a real-time communication module for setting up, expanding or improving real-time communication or a real-time capability to communicate over at least one of the connection interfaces of the switching network node. Such a real-time communication module can, for example, itself comprise one or more external connection interface(s) and can be configured for producing a real-time communication capability of these interfaces. Such a functional module can also affect the real-time capability or the capability for real-time communication via other connection interfaces located on the switching network node. The real-time communication can be set up, for example, solely for performing one of the above-stated cases or also for both of the cases.

Such real-time communication can be configured, for example, for producing the real-time capability over an industrial Ethernet, a PROFI-Net, a real-time Ethernet or a similar network or communication partner.

Such a real-time communication module can, for example, also include a clock generator (for example, a TCXO) and/or a time synchronization unit for time synchronization (for example to Institute of Electrical and Electronic Engineers (IEEE) Standard 1588) or for clock synchronization (for example, synchronization to the SyncE standard) or something similar.

A functional module can furthermore also comprise a synchronization module, for example, for clock synchronization within a communications network, for example, to the SyncE standard, or for time synchronization within a communications network, for example, to the IEEE 1588 standard. Such a synchronization module can furthermore also include a clock generator (for example, a TCXO).

The object stated above is likewise achieved by a switching network node in accordance with the contemplated embodiments of the invention with a switching network node base unit and a functional module and/or a port module in accordance with the disclosed embodiments.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The present invention will be described in more detail hereinafter by way of examples which refer to the accompanying FIGURE, in which:

The FIGURE is a schematic block diagram of an exemplary switch with port and functional modules in accordance with the invention.

DETAILED DESCRIPTION OF THE PREFERRED EMBODIMENTS

FIG. 1 shows an Ethernet switch 100 consisting of a base unit 110, a port module 170 inserted therein, a functional module 180 inserted therein and a combined functional port module 190.

The base unit comprises what is known as a backplane 112, comprising a Peripheral Component Interconnect (PCI) express system bus (PCIe bus) 122, an internal high-speed network bus 132 and a power supply bus 142. The power supply bus 142 is connected to a power supply unit 140 while the PCI express (PCIe) bus 122 is connected to a central processing unit (CPU) 120 of the base unit 110 and the high-speed network bus 132 is connected to a central data forwarding function block 130 (switch core). The CPU 120 is, moreover, also connected to the switch core 130, for example, for operation or configuration of the switch core 130.

The base unit 110 comprises a first module slot 114 in which the port module 170 is installed. A PCIe plug 124, a network plug 134 and a power supply plug 144 are installed in the module slot 114, which are connected to the respective buses of the backplane 112. The port module comprises a network plug 176 and a power supply plug 172 in the rear region for insertion into the corresponding plugs of the module slot. The port module 170 also comprises a first Ethernet interface 178 and a second Ethernet interface 179 for connecting Ethernet cables. Information arriving to the Ethernet interface 178, 179 can be forwarded over the network bus plugs 176 of the module and of the module slot 134 to the network bus 132 and to the switch core 130 and are passed from there to corresponding ports of the switch 100.

A display module 180 is installed as a functional module 180 in a second module slot of the base unit 110, which again comprises a PCIe plug 126, a network bus plug 136 and a power supply plug 146. This display module 180 comprises a PCIe plug 184 and a power supply plug 182 which are plugged in the receiving state shown in FIG. 1 into the corresponding plugs 126, 146 of the second module slot 116. The additional network bus plug 136 present in this module slot is not used by the display module 180. The display module 180 also comprises a screen 188 for display, for example, of the state of individual ports or connection interfaces of the switch 100. The information illustrated on the display 188 can also be sent through the PCIe plugs 184, 126 and the PCIe bus 122 to the CPU 120 which then, optionally after obtaining additional information, for example, from the switch core 130, re-sends the additional information on the path back to the display module 180.

Located in a third module slot 118 of the base unit 110 is a combined port-functional module 190 which can be, for example, a firewall module 190. In FIG. 1, this fireball module 190 is not yet completely incorporated in the module slot 118, so in the state shown in FIG. 1 it is not yet functional in switch 100.

The third module slot 118 again comprises a PCIe plug 128, a network bus plug 138 and a power supply plug 148. The firewall module 190 accordingly also comprises a PCIe plug 194, a network bus plug 196 and a power supply plug 192 which in the fully-introduced state of the firewall module 190 are inserted in the corresponding sockets 128, 138, 148 of the third module slot 118. The firewall module also comprises an Ethernet interface 198 for connection to an external Ethernet cable. A firewall unit provided on the firewall module 190 can be configured, for example, by the CPU 120, over the PCIe bus 122 and the PCIe plug 128, 194 of the third module slot 118 and the firewall module 190. In this way, an Ethernet network, for example, connected through an Ethernet interface 198 of the firewall module 190 can be secured by this firewall. Communication between, for example, the switch core 130 and the Ethernet port 198 of the firewall module 190 then takes place internally the network bus plugs 138, 196 of the third module slot 118 and the firewall module 190 and network bus 132.

The base unit 110 also comprises a permanently installed Ethernet port 139 that is likewise connected through the network back-wall bus 132 to the switch core 130 of the switch 100.

The firewall module 190 can, for example, also be configured such that networks connected to the other Ethernet ports 178, 179, 139 of the Ethernet port may be secured by the firewall functionality of the firewall module 190. In the process it can be established, for example, with the CPU 120 and the switch core 130 which of the Ethernet connections 178, 179, 139 this affects, and the corresponding communication can be routed internally through the firewall module 190.

The present invention relates to a modular switch for communications networks, i.e., for industrial communications networks, where it is possible for the functionality of the switch to be increased in that a port module present in the switch for connecting communication cables can be swapped for a functional module to increase the functionality of the switch.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A modular switching network node of an industrial communications network comprising a PROFINET, the modular switching network node comprising:

- at least one port module comprising at least one connection interface for coupling to the industrial communications network comprising the PROFINET; and
- a switching node based unit arranged in the industrial communications network comprising the PROFINET, the switching node base unit comprising a backplane having (i) an internal network bus connected to a switch core for forwarding communication data received over the at least one connection interface, (ii) a system bus connected to a central processing unit and (iii) a power supply bus connected to a power supply unit;
- wherein the modular switching network node is configured to forward communication data arriving over the at least one connection interface to at least one additional connection interface of the modular switching network node, communication data arriving over the at least one connection interface not being forwarded upon determining that a receiver of the communication data is already located in a communication branch from which the communication data to the switching network node base unit originated; and
- wherein the switching network node base unit is configured such that the at least one port module is swappable for a functional module to expand a functionality of the modular switching network node.

2. The modular switching network node as claimed in claim 1, wherein the switching network node base unit comprises at least one module receiving region configured to receive one of the at least one port module and the functional module.

3. The modular switching network node as claimed in claim 2, wherein the system bus is configured for communication with the central processing unit of the modular switching network node; and wherein the switching network node base unit comprises, in a region of the at least one module receiving region, a network bus interface for contacting port modules located in the module-receiving region and a system bus interface for contacting functional modules located in the at least one module-receiving region.

4. The modular switching network node as claimed in claim 2, wherein the switching network node base unit is configured to at least one of detect and configure a functional module located in one of the at least one module receiving region.

5. The modular switching network node as claimed in claim 3, wherein the switching network node base unit is configured to at least one of detect and configure a functional module located in one of the at least one module-receiving region.

6. The modular switching network node as claimed in claim 2, wherein the switching network node base unit is configured to at least one of configure and diagnose functional modules located in one of the at least one module receiving region over a user interface of the switching network node.

7. A functional module of a switching network node base unit of a modular switching network node for an industrial communications network comprising a PROFINET, wherein the switching network node base unit is arranged in the industrial communications network comprising the PROFINET, wherein the switching network node base unit comprises a backplane having (i) an internal network bus connected to a switch core for forwarding communication data, (ii) a system bus connected to a central processing unit and (iii) a power supply bus connected to a power supply unit, and wherein the switching network node base unit is configured such that a port module is swappable for the functional module to expand a functionality of the modular switching network node, the functional node comprising:

at least one connection interface, wherein the functional module is configured to forward communication data arriving over the at least one connection interface to at least one additional connection interface of the modular switching network node for the industrial communications network comprising the PROFINET, and is configured to not forward communication data arriving over the at least one connection interface upon determining that a receiver of the communication data is already located in a communication branch from which the communication data to the switching network node base unit comprising the backplane having (i) the internal network bus connected to the switch core, (ii) the system bus connected to the central processing unit and (iii) the power supply bus connected to the power supply unit originated.

8. The functional module as claimed in claim 7, wherein the functional module comprises a module system bus interface for communication with a system bus interface of a module-receiving region of the switching network node base unit in communication with the system bus of the switching network node base unit, and wherein the system bus is configured for communication with the central processing unit of the modular switching network node.

9. The functional module as claimed in claim 8, wherein the functional module further comprises a module network bus interface for communication with a network bus interface of the module-receiving region of the switching network node base unit, the network bus interface of the module-receiving region being connected to the internal network bus of the switching network node base unit for forwarding communication data received over connection interfaces within the switching network node base unit.

10. The functional module as claimed in claim 7, wherein the functional module comprises one of an additional arithmetic logic unit and central unit configured to support the central processing unit of the modular switching network node.

11. The functional module as claimed in claim 7, wherein the functional module comprises a server module for implementing a server functionality with an independent central unit.

12. The functional module as claimed in claim 7, wherein the functional module comprises at least one of a display module and an operating module for the modular switching network node.

13. The functional module as claimed in claim 7, wherein the functional module comprises an energy saving-module for at least one of setting up and operating energy saving functionalities of the modular switching network node or for the modular switching network node.

14. The functional module as claimed in claim 7, wherein the functional module comprises a communication security module including a functionality for at least one of setting up and increasing security functions during communication over at least one of the connection interfaces of the modular switching network node.

15. The functional module as claimed in claim 7, wherein the functional module comprises a real time-communication module configured to one of set up, expand and improve real-time communication over at least one of the connection interfaces of the modular switching network node.

16. A modular switching network node of an industrial communications network comprising a PROFINET, the modular switching network node comprising:

a switching network node base unit for arrangement in the industrial communications network comprising the PROFINET;

at least one of:

a port module comprising at least one connection interface for coupling to the industrial communications network comprising the PROFINET;

a functional module configured to forward communication data arriving over the at least one connection interface to at least one additional connection interface of the modular switching network node;

the switching network node base unit being configured such that the port module is swappable for the functional module to expand a functionality of the switching network node;

wherein the switching network node base unit comprises at least one module receiving region configured to receive one of the port module and the functional module, a backplane having (i) an internal network bus connected to a switch core for forwarding communication data received over the at least one connection interface, (ii) a system bus connected to a central processing unit and (iii) a power supply bus connected to a power supply unit; and wherein the modular switching network node is configured to forward communication data arriving over the at least one connection interface to at least one additional connection interface of the modular switching network node, communication data arriving over the at least one connection interface not being forwarded upon determining that a receiver of the communication data is already located in a communication branch from which the communication data to the switching network node base unit originated.

* * * * *